(12) United States Patent
Lee et al.

(10) Patent No.: US 9,595,587 B2
(45) Date of Patent: Mar. 14, 2017

(54) SPLIT POLY CONNECTION VIA THROUGH-POLY-CONTACT (TPC) IN SPLIT-GATE BASED POWER MOSFETS

(71) Applicant: Alpha and Omega Semiconductor Incorporated, Sunnyvale, CA (US)

(72) Inventors: Yeeheng Lee, San Jose, CA (US); Sik Lui, Sunnyvale, CA (US); Jongoh Kim, Portland, OR (US); Hong Chang, Cupertino, CA (US); Madhur Bobde, Sunnyvale, CA (US); Lingpeng Guan, San Jose, CA (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 8 days.

(21) Appl. No.: 14/260,215

(22) Filed: Apr. 23, 2014

(65) Prior Publication Data
US 2015/0311295 A1   Oct. 29, 2015

(51) Int. Cl.
H01L 21/336 (2006.01)
H01L 29/40 (2006.01)
H01L 29/78 (2006.01)
H01L 29/423 (2006.01)
H01L 29/66 (2006.01)
H01L 21/28 (2006.01)

(52) U.S. Cl.
CPC ...... *H01L 29/407* (2013.01); *H01L 21/28008* (2013.01); *H01L 29/4236* (2013.01); *H01L 29/66666* (2013.01); *H01L 29/7827* (2013.01)

(58) Field of Classification Search
CPC .................... H01L 29/66734; H01L 29/7813
USPC ................ 438/270, 589, 272, 259; 257/330, 257/E21.419, E21.284
See application file for complete search history.

(56) References Cited

U.S. PATENT DOCUMENTS

| 7,504,676 B2 | 3/2009 | Bhalla et al. |
| 7,585,705 B2 * | 9/2009 | Pan ..................... H01L 27/0255 257/173 |
| 8,053,298 B2 | 11/2011 | Bhalla et al. |
| 8,394,702 B2 | 3/2013 | Tai et al. |

(Continued)

*Primary Examiner* — Julia Slutsker
(74) *Attorney, Agent, or Firm* — Joshua D. Isenberg; JDI Patent

(57) ABSTRACT

Embodiments of the present disclosure provide a contact structure in a split-gate trench transistor device for electrically connecting the top electrode to the bottom electrode inside the trench. The transistor device comprises a semiconductor substrate and one or more trenches formed in the semiconductor substrate. The trenches are lined with insulating materials along the sidewalls inside the trenches. Each trench has a bottom electrode in lower portions of the trench and a top electrode in its upper portions. The bottom electrode and the top electrode are separated by an insulating material. A contact structure filled with conductive materials is formed in each trench in an area outside of an active region of the device to connect the top electrode and the bottom electrode. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

7 Claims, 15 Drawing Sheets

(56) References Cited

U.S. PATENT DOCUMENTS

| | | |
|---|---|---|
| 8,507,978 B2 | 8/2013 | Bhalla et al. |
| 8,618,601 B2 | 12/2013 | Chen |
| 2006/0209887 A1 | 9/2006 | Bhalla et al. |
| 2007/0155104 A1* | 7/2007 | Marchant .............. H01L 29/407 438/270 |
| 2007/0158701 A1 | 7/2007 | Chang et al. |
| 2007/0194374 A1 | 8/2007 | Bhalla et al. |
| 2009/0072301 A1 | 3/2009 | Bhalla et al. |
| 2009/0148995 A1 | 6/2009 | Chang et al. |
| 2010/0044792 A1 | 2/2010 | Hebert |
| 2011/0037120 A1 | 2/2011 | Chen et al. |
| 2011/0039383 A1 | 2/2011 | Chen et al. |
| 2011/0068386 A1 | 3/2011 | Tai et al. |
| 2011/0133258 A1 | 6/2011 | Chen |
| 2011/0204440 A1 | 8/2011 | Bhalla et al. |
| 2011/0220990 A1 | 9/2011 | Chang et al. |
| 2012/0098059 A1 | 4/2012 | Tai et al. |
| 2012/0187472 A1* | 7/2012 | Chang ................ H01L 27/0259 257/328 |
| 2012/0205737 A1 | 8/2012 | Chen et al. |
| 2013/0105886 A1 | 5/2013 | Lui et al. |
| 2013/0328122 A1* | 12/2013 | Li ........................ H01L 29/407 257/334 |
| 2014/0134813 A1 | 5/2014 | Chen |

\* cited by examiner

SPLIT POLY CONNECTION VIA THROUGH-POLY-CONTACT (TPC) IN SPLIT-GATE BASED POWER MOSFETS

FIELD OF THE INVENTION

This present disclosure relates in general to the semiconductor power devices, and more particularly to split-gate trench MOSFETs and methods of manufacturing such devices.

BACKGROUND OF THE INVENTIONS

Power metal oxide semiconductor field effect transistors (MOSFETs) are commonly used power devices due to their low gate drive power, fast switching speed and superior paralleling capability. Most power MOSFETs feature a vertical structure with source and drain regions on opposite sides of a gate trench filled with polysilicon as gate electrodes. In such structures, the MOS channels are formed along the vertical walls of the trenches. One configuration of a trench MOSFET device includes a gate trench lined with thicker oxide in the lower part of the trench and thinner oxide in its upper part. Thus, the oxide has a stepped structure, there being a step in its thickness. The stepped gate structure with a thicker oxide at the bottom portion of the trench increases the breakdown voltage of the device.

In recent years, split-gate trench structures are developed and preferred for certain applications over conventional trench MOSFETs. A split-gate trench power MOSFET comprises two electrodes in a gate trench. A first electrode serves as the gate electrode to control the channel formation of the MOSFET, and a second electrode serves as shield electrode to decrease the capacitance $C_{gd}$ between drain electrode and gate electrode. Generally, the gate electrode and the shield electrode are formed in a self-aligned process that uses a single mask to form a set of trenches that are used for both the gate electrode and the shield electrode. Since the shield electrode is at source potential, it usually extends to surface and is further coupled to a pick-up structure at a terminal region which is located at sides of the MOSFET. This increases the source electrode resistance. Furthermore, extra masks are needed to create such connection and thereby increasing the cost of manufacturing.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
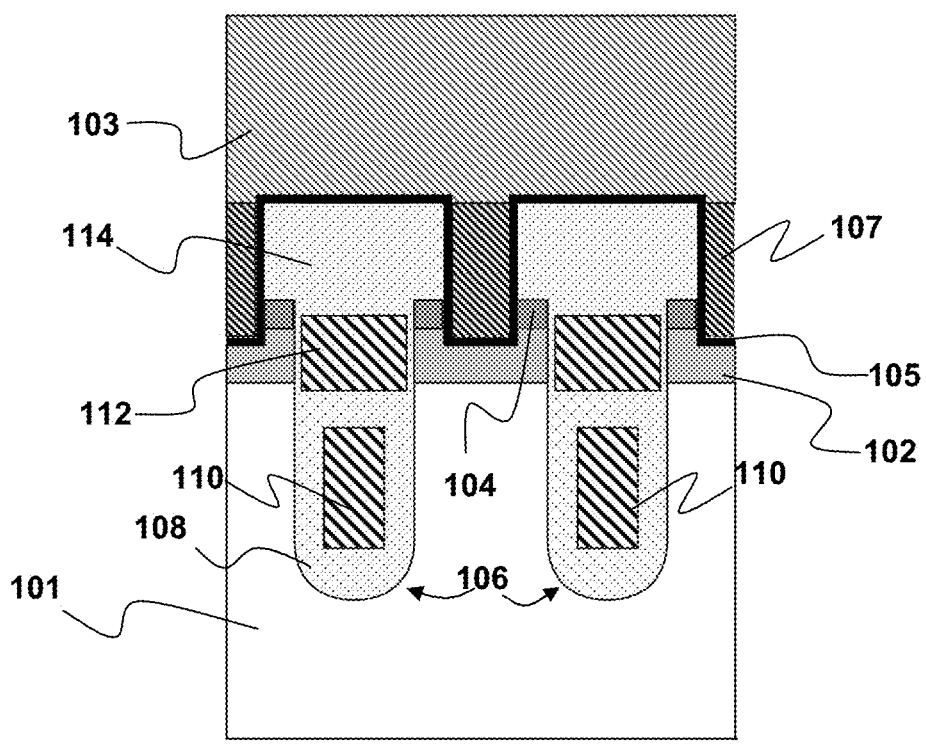
FIG. 1A is a cross-sectional schematic diagram of a split-gate trench transistor device of the prior art.

FIG. 1A illustrates a typical prior art split-gate trench power MOSFET 100. The device 100 is generally formed on a semiconductor substrate 101, a lower portion of which is doped with dopants of a first conductivity type to act as a drain. A body region 102 doped with dopants of a second conductivity type opposite to the first conductivity type is formed near a surface of the substrate 101. A source region 104 is formed in the body region 102 at or near the surface of the substrate. The source region is doped with the dopants of the first conductivity type, but more heavily doped than the drain region. The source region 104 is electrically connected to a source metal 103, e.g., via a barrier metal 105 and a conductive plug 107.

Trenches 106 are formed in the substrate through the body region. The trenches 106 are lined with an insulating material 108, e.g., an oxide. The oxide 108 in the bottom portion of the trench is usually thicker than the oxide 108 in the top portion. A bottom electrode 110 is formed in a lower portion of each trench 106. A top electrode 112 is formed in an upper portion. The bottom electrode 110 is insulated from the top electrode 112 by the oxide 108. Another insulating material 114 electrically insulates the top electrode 112 from the source metal 103.

Figure 1B:
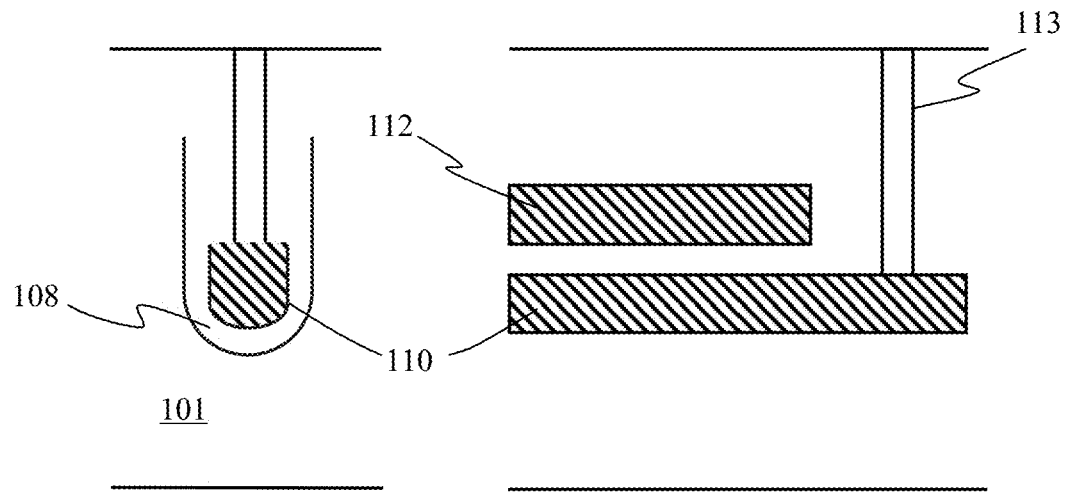
FIG. 1B and FIG. 1C show the conventional approaches to connect the gate poly and the shield poly of a split-gate structure while keeping dual layers of oxides.
Figure 1C:
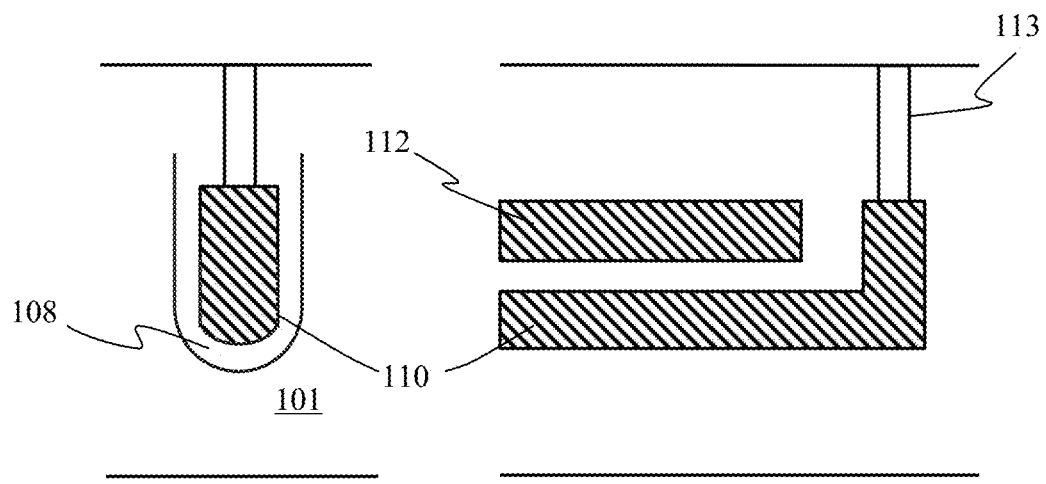

It is noted that, in certain applications, there is a need to connect the top and bottom electrodes 110 and 112 together while keeping dual layers of oxides with two thicknesses for the top and bottom electrodes. Conventional approaches to connect these electrodes may include a straight contact structure 113 filled with conductive materials that connects all the way through to a bottom electrode 110 in a trench with no top electrode as shown in FIG. 1B. It would however require an additional mask after the poly 1 layer, forming the bottom electrode 110, is etched back to protect the bottom electrode 110 from formation of the top electrode 112 (i.e., poly 2 layer). Another approach may include having a bottom electrode 110 in a trench with no top electrode that is thicker enough to the level as the top electrodes 112 in other trenches as shown in FIG. 1C. However, it would require an additional poly mask after the CMP process is applied to the poly 1 layer to shield the bottom electrode from the poly etch back.

Embodiments of the present invention provide a through-poly-contact (TPC) structure in split-gate transistor devices for electrically connecting the top electrode to the bottom electrode. Specifically, a TPC structure can be formed in the same contact etch step by etching all the way through the top electrode, the inter-polysilicon oxide and the bottom electrode and filling conductive materials to form a single deep conductive plug. For embodiments where an electrical connection between the top and bottom electrodes is not desired, one additional mask is required after formation of the top electrode to form an insulating structure filled with insulating materials in the top electrode to break the electrical connection with the bottom electrode.

Figure 2:
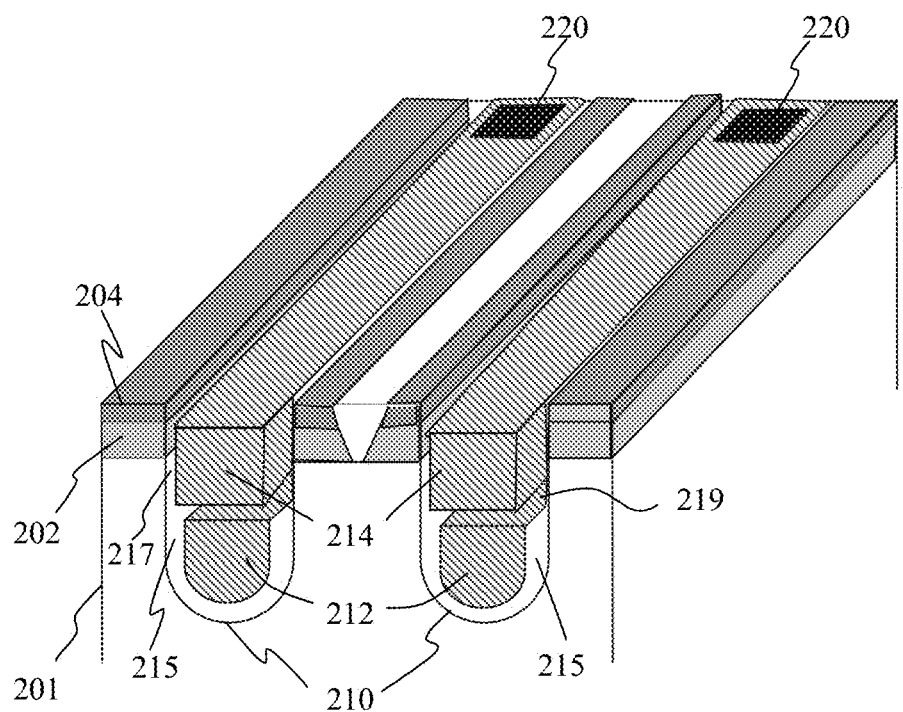
FIG. 2 is a three-dimensional view of a split-gate trench transistor device according to an embodiment of the present disclosure.

FIG. 2 illustrates a portion of a split-gate transistor device 200 according to an embodiment of the present invention. It is noted that, in FIG. 2, oxide and metal layers are omitted to reveal the structure of the transistor device. The device 200 is formed on a semiconductor substrate 201, which may be made of suitably doped silicon. A lower portion of the substrate 201 may be doped to provide a desired first conductivity type (e.g., N-type or P-type). The lower portion of the substrate 201 can act as a drain for the device 200. Body regions 202 and source regions 204 are formed in upper portions of the substrate 201. The body regions 202 are doped with dopants that provide the body regions with a second conductivity type that is opposite to the first conductivity type of the lower portions of the substrate. The source regions 204 are doped with dopants with the first conductivity type but more heavily doped than the lower portions of substrate 201. By way of example and not by way of limitation, the lower portions of the substrate 201 may be doped with N-type dopant, the body regions 202 may be doped with P-type dopant and the source regions 204 may be more heavily doped with N-type dopant.

One or more split-gate trenches 210 are formed in the semiconductor substrate 201. One or more bottom electrodes 212 are formed in the bottom of the trench 210. The bottom electrodes 212 are electrically insulated from the semiconductor substrate, e.g., by an insulator material 215, such as an oxide or nitride, which may coat the walls of a set of the split-gate trenches 210 in which the bottom electrodes are formed. One or more top electrodes 214 are formed in the top portion of the split-gate trenches 210 between the bottom electrodes and a surface of the substrate. The top electrodes 214 are separated from the semiconductor substrate 201 by an insulating material 217 such as oxide or nitride and separated from the one or more bottom electrodes 212 by an inter-poly dielectric layer (or poly oxide) 219. In some embodiments, the insulating material 217 has a thickness less than that of the insulating material 215. As shown in FIG. 2, at one end of each split-gate trench 210, a contact structure 220 is provided to electrically connect between the top electrode 214 and bottom electrode 212.

Figure 3:
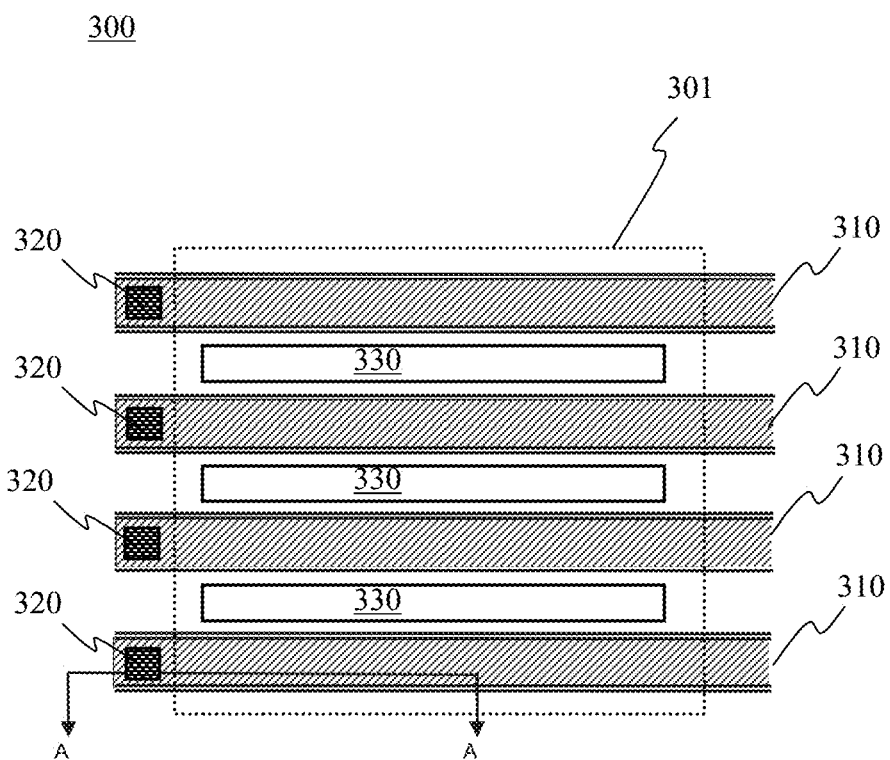
FIG. 3 is a top view schematic diagram of a split-gate trench transistor device according to an embodiment of the present disclosure.

FIG. 3 is a diagram illustrating a top view of a portion of a split-gate transistor device according to an embodiment of the present invention. The active region 301 includes a plurality of gate trenches 310 in which split-gate structures are formed. In each gate trench 310, a contact structure 320 is formed at one end of the trench outside of the active region 301. The active region 301 further includes a self-aligned contact openings 330 in which contacts are formed to electrically connect source regions and body regions to the source metal (not shown).

Figure 4A:
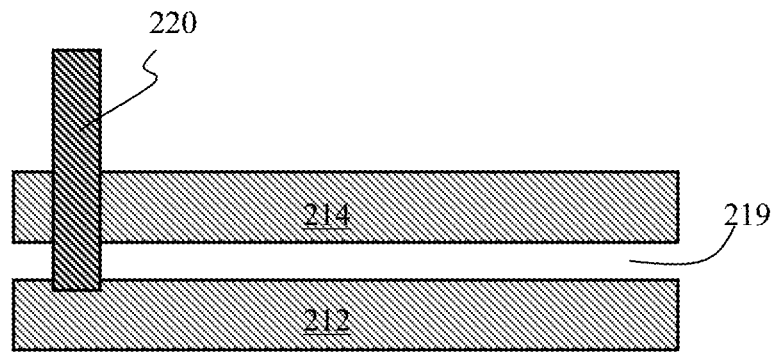
FIG. 4A is a cross-sectional schematic diagram taken along line A-A of FIG. 3 according to an embodiment of the present disclosure.
Figure 4B:
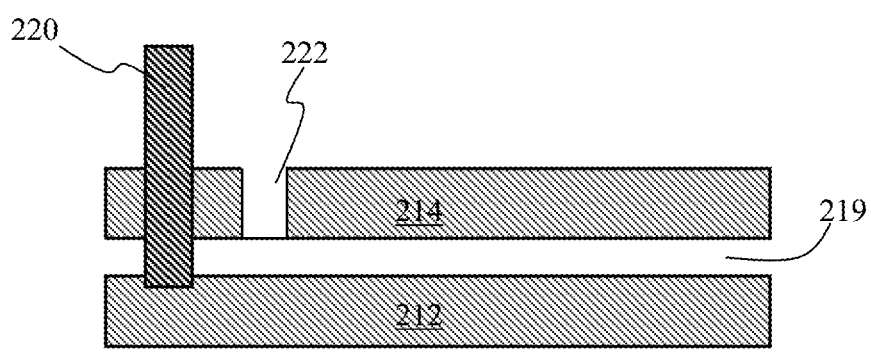
FIG. 4B is a cross-sectional schematic diagram taken along line A-A of FIG. 3 according to an alternative embodiment of the present disclosure.
Figure 4C:
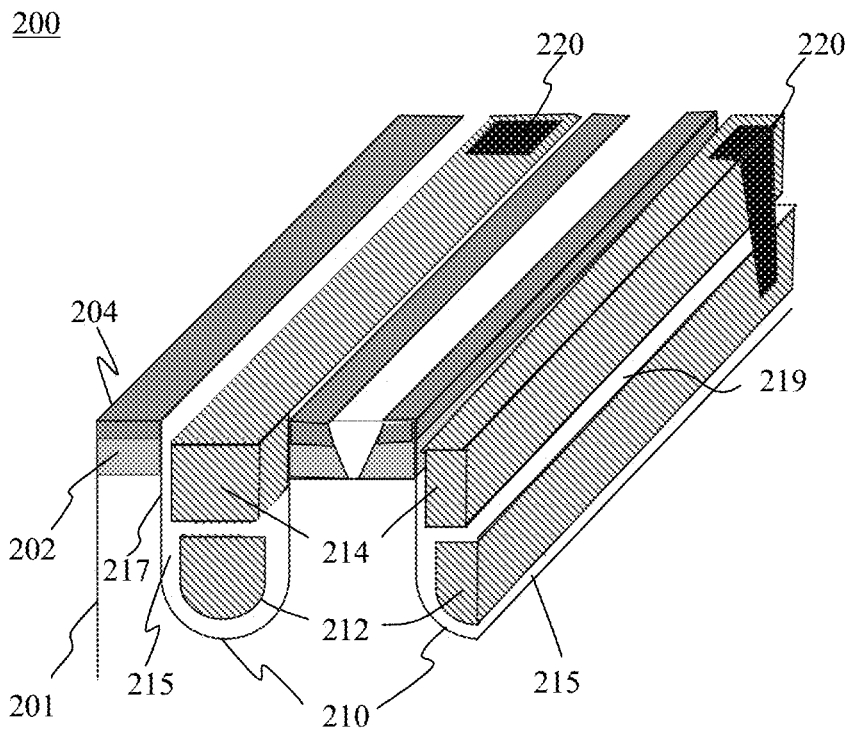
FIG. 4C is a three-dimensional view of a transistor device according to an embodiment of the present disclosure.

FIG. 4A and FIG. 4C illustrate an embodiment where an electrical connection between the top and bottom electrodes is required. The contact structure 220 reaches to the bottom electrode 212 by etching through the top electrode 214 and the inter-poly dielectric layer 219. By way of example but not by way of limitation, the contact structure 220 may be a tungsten contact, poly plug or filled with other conductive materials. In an embodiment where the contact structure 220 is a poly plug, a discontinuity between the top electrode and the poly plug exists due to, e.g., different grain structure, a native oxide, formation at different times.

Figure 4D:
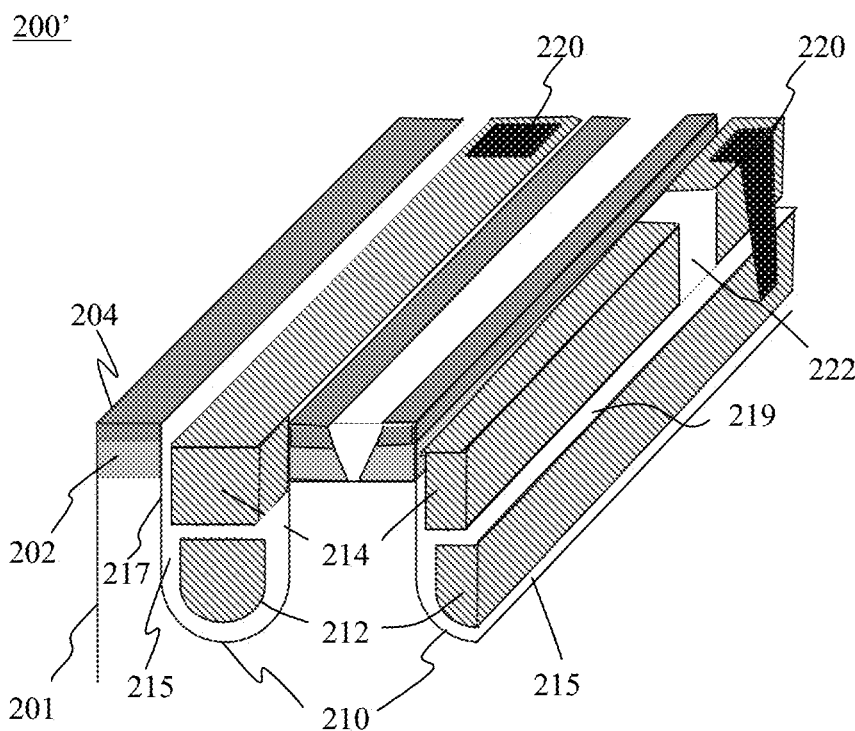
FIG. 4D is a three-dimensional view of a split-gate trench transistor device according to an alternative embodiment of the present disclosure.

FIG. 4B and FIG. 4D illustrate an implementation where an electrical connection between the top and bottom electrode is not desired. An insulating structure 222 is formed in the top electrode 214 near the contact structure 220 to break the top electrode at some point to remove the short/connection between the top and bottom electrodes. In such implementations, an additional mask is required for etching poly-silicon in top electrode and filling oxides to form the insulating structure 222.

Figure 5A:
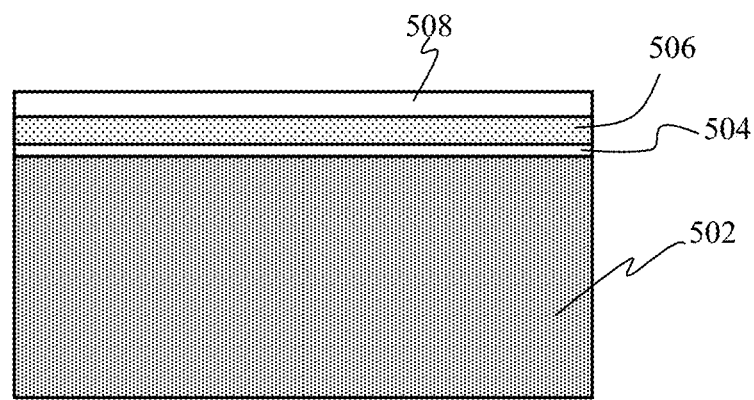
FIGS. 5A-5Q is a sequence of cross-sectional schematic diagrams illustrating a method of fabrication of the device of FIG. 2.
Figure 5B:
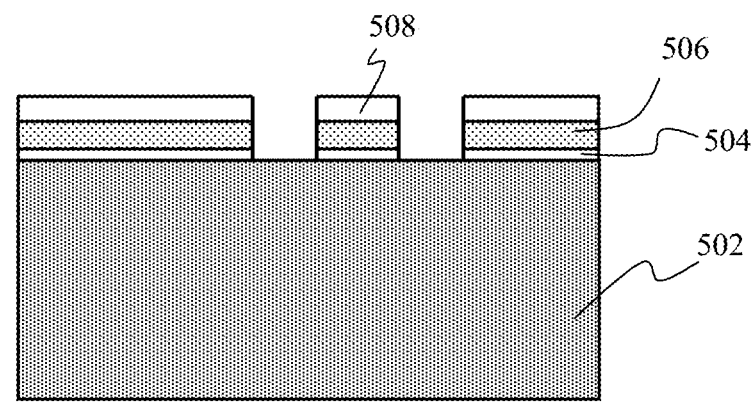

Aspects of the present disclosure include methods for fabricating a split-gate trench transistor device of the types described above. By way of example, and not by way of limitation, a split-gate trench transistor device like the device of FIGS. 2 and 3 may be fabricated as depicted in FIGS. 5A-5Q, which illustrate the fabrication at different stages across active gate trenches.

In the following discussion, an N-type device is described for purposes of illustration. P-type devices may be fabricated using a similar process but with opposite conductivity types. In FIG. 5A, an N-type substrate 502 (e.g., an N+ silicon wafer with an N− epi layer grown on it) is used as the drain of the device. In some embodiments, the doping concentration for the upper portions of the substrate 502 is approximately $1 \times 10^{16}$-$1 \times 10^{17}$ dopants/cm$^3$, with thickness of 2-4 μm, and substrate resistivity of 0.5-3 mohm*cm.

A hard mask layer can be formed on top of the substrate 502, for example, by forming a thin oxide layer 504 on the substrate 502 by deposition or thermal oxidation, followed by a nitride layer 506 on top of the thin oxide layer 504. In some embodiments, the thickness of the silicon oxide layer ranges from about 100 Å to 500 Å and is preferably about 200 Å. In some embodiments, the thickness of the nitride layer ranges from 1500 Å to 4000 Å and is preferably about 3500 Å. Another oxide layer 508 may be disposed on top of the nitride layer 506 to form the hard mask with an oxide/nitride/oxide stack. In some embodiments, the thickness of the oxide layer 508 ranges from 1000 Å to 3000 Å and is preferably about 2000 Å. A photo resist layer (not shown) is then applied on top of the oxide/nitride/oxide stack and patterned using a trench mask. A hard mask etch is then performed to etch away exposed portions of the nitride layer 506 and oxide layers 504 and 508 as shown in FIG. 5B. The etching stops at the silicon surface leaving an opening that will be used to mask the etching of trenches.

Figure 5C:
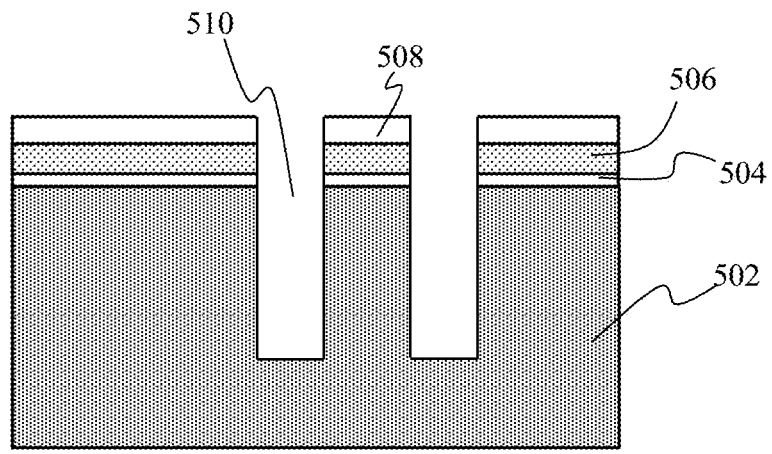
Figure 5D:
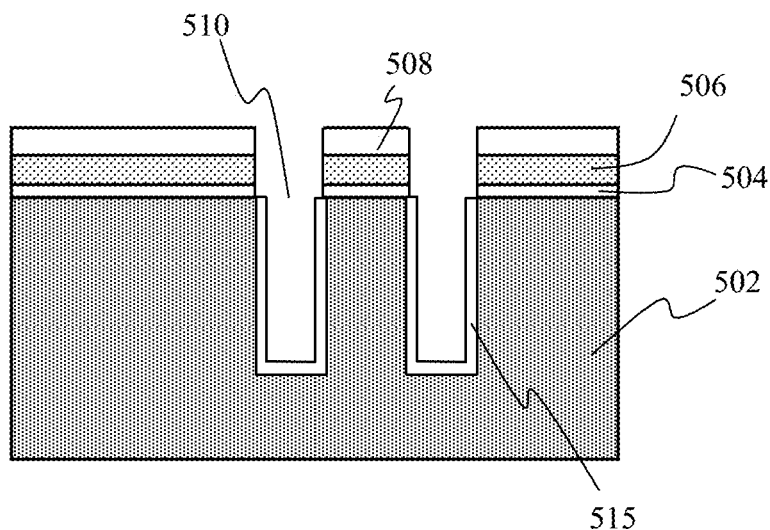

In FIG. 5C, the trench openings are etched into the semiconductor substrate 502 forming trenches 510. In some embodiments, the target depth of the trenches is approximately 0.3-1.5 μm, preferably about 1.0 μm. In FIG. 5D, a sacrificial oxidation is performed to remove the damaged surface on the trench wall to smooth the sidewalls. After removing the sacrificial oxide an oxidation is performed to grow a liner oxide layer 515. A thick oxide layer 515 is grown to a thickness based on device optimization for low $R_{ds}$ and high breakdown voltage. In some embodiments, the thickness of the oxide layer 515 is about 400-600 Å and preferably 600 Å. A partial high density plasma oxide is deposited and densified for forming thick bottom oxide. As one example, the densification takes place at a temperature of approximately 1150° C. and lasts for approximately 30 seconds. After that, the oxide 515 on the trench sidewalls has a substantially uniform thickness throughout the device.

Figure 5E:
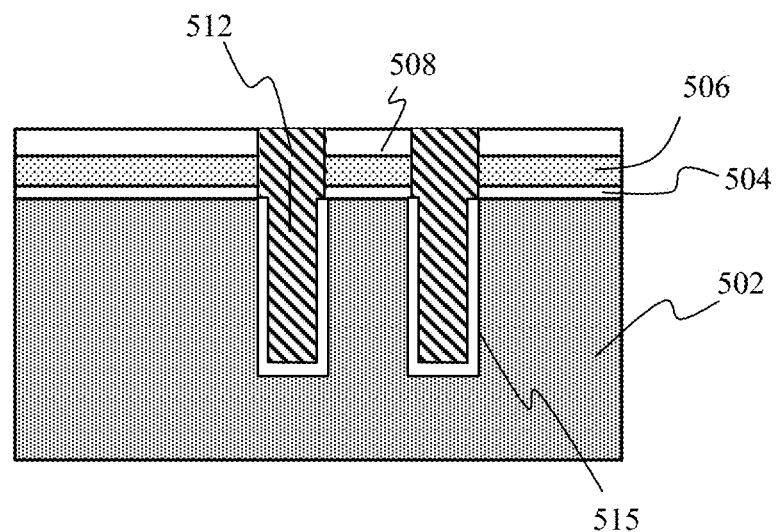
Figure 5F:
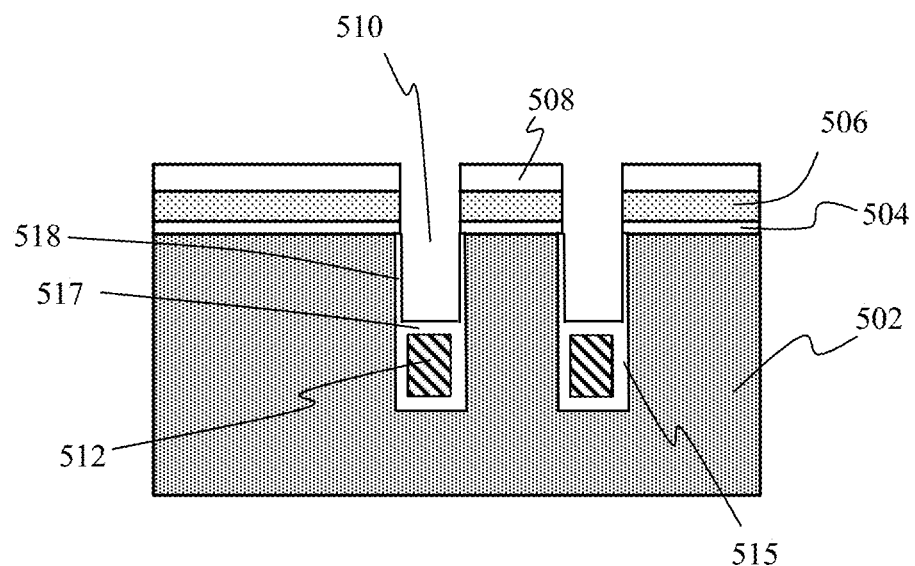

Next, conductive material 512, such as polysilicon, is deposited into the trenches and over the semiconductor substrate followed by a chemical mechanical polishing (CMP) to remove polysilicon over the oxide layer 508 leaving the conductive material only in the trench 510 as shown in FIG. 5E. This layer of conductive material is sometimes referred to as source poly, shield poly or Poly 1.

The conductive material layer 512 is then etched back in the upper portions of the trenches. In one example, the conductive material layer 512 is etched to a target depth using a timed etch-back process. In some embodiments, the conductive material layer 512 is etched to a depth about 0.55 μm below the surface of the semiconductor substrate 502. Then the liner oxide 515 along the etched upper portion of the trenches is stripped, e.g., using a wet etch. A thin insulating layer 518 (e.g., gate oxide) is formed to cover the upper portion of trench wall and another thin insulating layer 517 (e.g., poly oxide) is formed atop the bottom portion of the conductive material layer 512 as shown in 5F forming the bottom electrode. The insulating layer 518 is about 150 to 500 Angstroms (Å) in thickness and the insulating layer 517 is about 250 to 800 Å in thickness.

A second layer of conductive material 514, such as polysilicon, is deposited into upper portion of the trenches and over the substrate followed by a CMP to remove polysilicon over the oxide layer 508. In the particular case of polysilicon, this layer of conductive material is sometimes referred to as gate poly or Poly 2. The second conductive layer 514 is then etched back preferably about 500 Å above the top surface of the substrate 502.

Figure 5G:
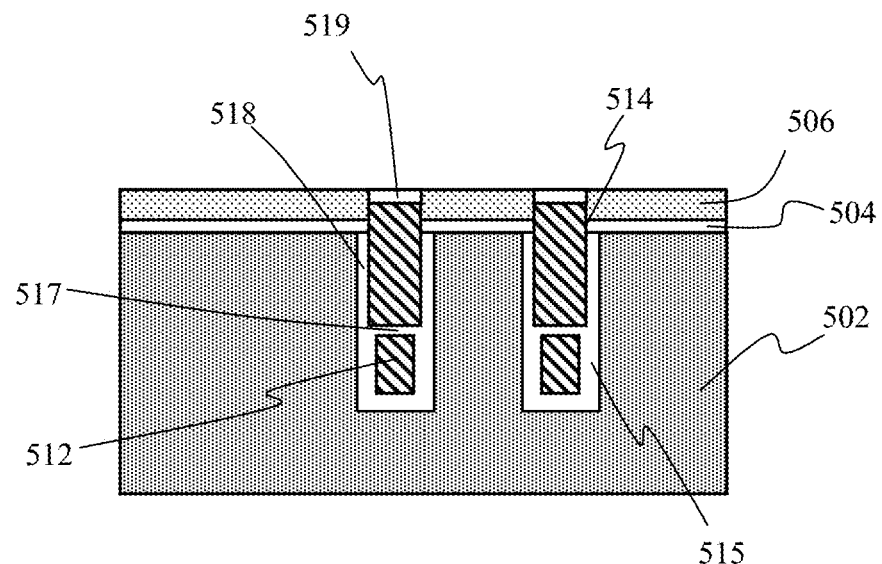

Another oxidation step is performed in the trenches forming the oxide later 519 followed by a CMP to remove oxides 519 and oxide layer 508 above the nitride layer 506 as shown in FIG. 5G.

Figure 5H:
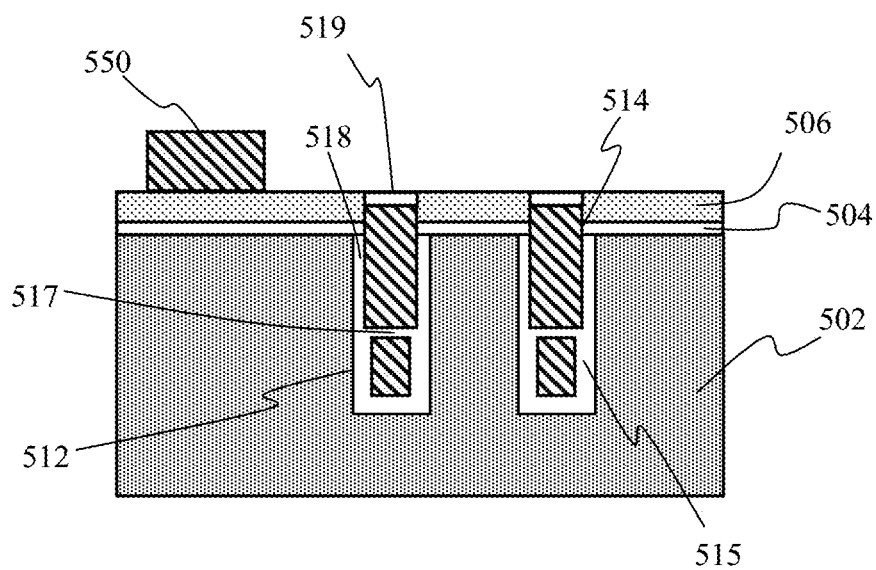
Figure 5I:
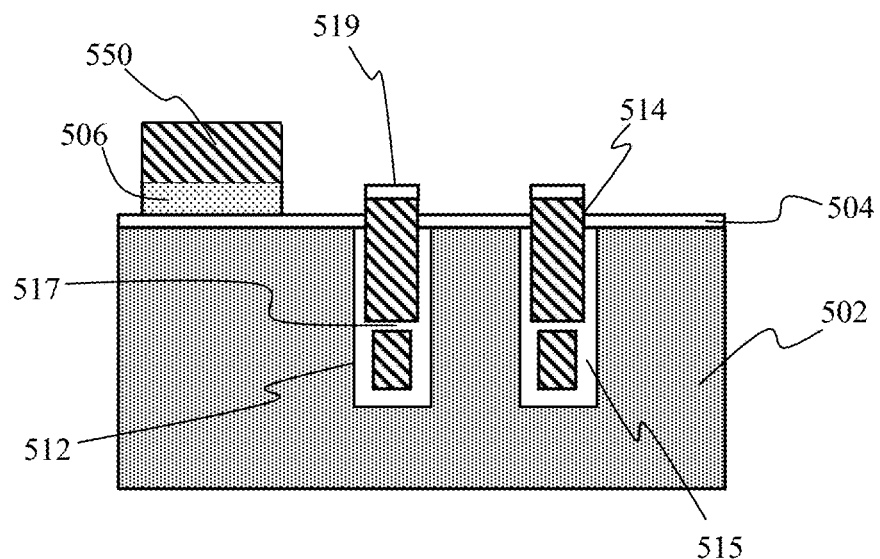

FIG. 5H shows an optional step for forming an ESD structure to provide electrostatic discharge (ESD) protection to the device. First, an ESD polysilicon layer 550 is deposited on top of the nitride layer 506, followed by an ESD blanket implant. The implanted dopants are of a conductivity type opposite to the conductivity type of the substrate 502. In one example, the thickness of the ESD polysilicon layer 550 is about 6000 Å. Using an ESD mask, the exposed ESD polysilicon layer 550 is etched and the etching stops at the nitride layer 506. Next, the nitride layer 506 is stripped using a wet etch and thereby portions of the oxide layer 504 are exposed as shown in FIG. 5I.

Figure 5J:
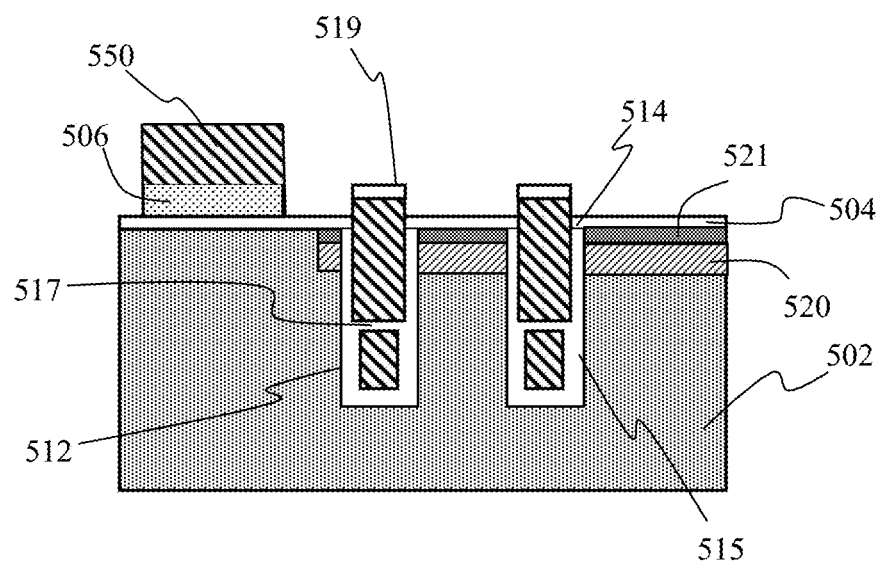

In FIG. 5J, a body dopant implant to form a plurality of body regions 520 is carried out by employing a body mask. The body mask is removed followed by a body diffusion to form the body region. The body drive diffuses the dopant to a desired depth. Then another mask as source mask is applied to carry out a source dopant implant to form a plurality of source regions 521.

Figure 5K:
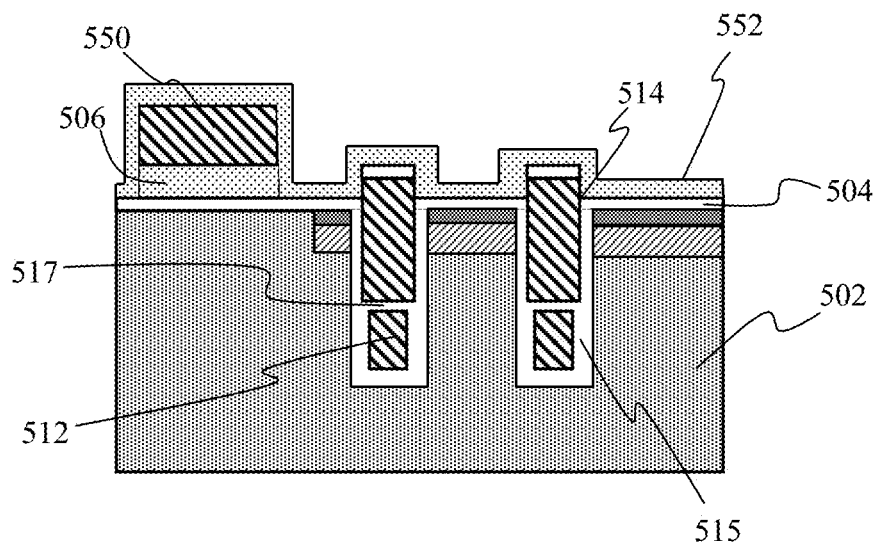
Figure 5L:
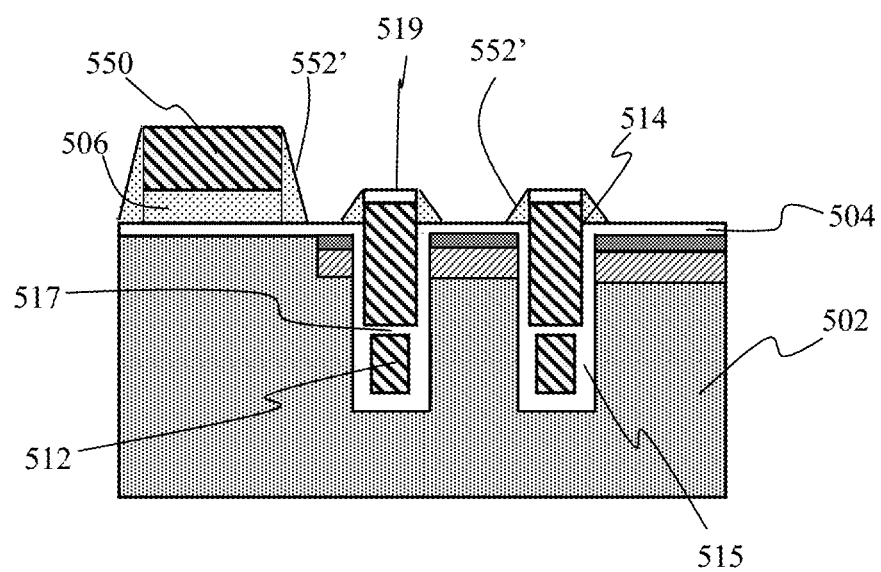
Figure 5M:
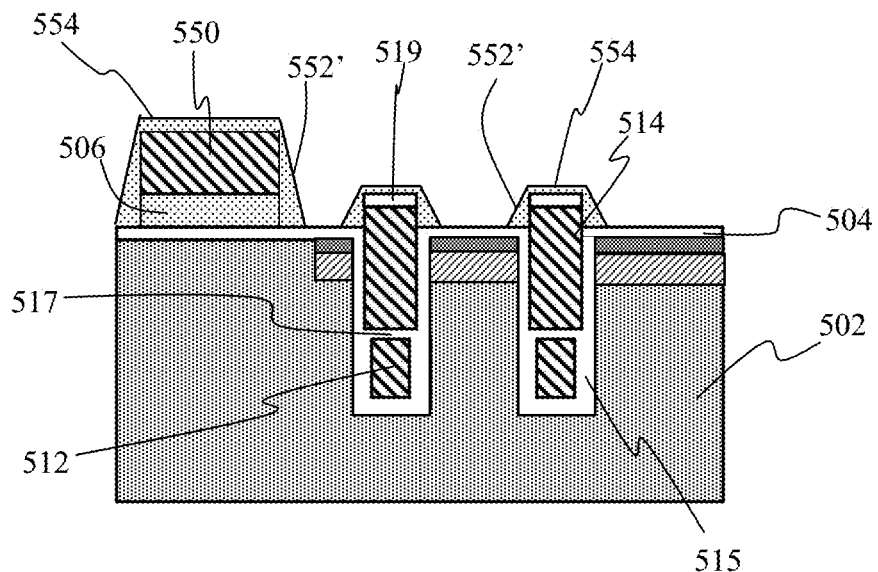

FIG. 5K shows a layer of nitride 552 is deposited over the top of the structure of FIG. 5J. In one example, the thickness of the nitride layer 552 is about 800 Å. The nitride layer 552 is anisotropically etched back along the horizontal surface to form nitride spacers 552' along the walls as shown in FIG. 5L. Following that, a stop layer of nitride 554 is deposited as shown in FIG. 5M. In one example, the thickness of the nitride stop layer 554 is about 300 Å.

Figure 5N:
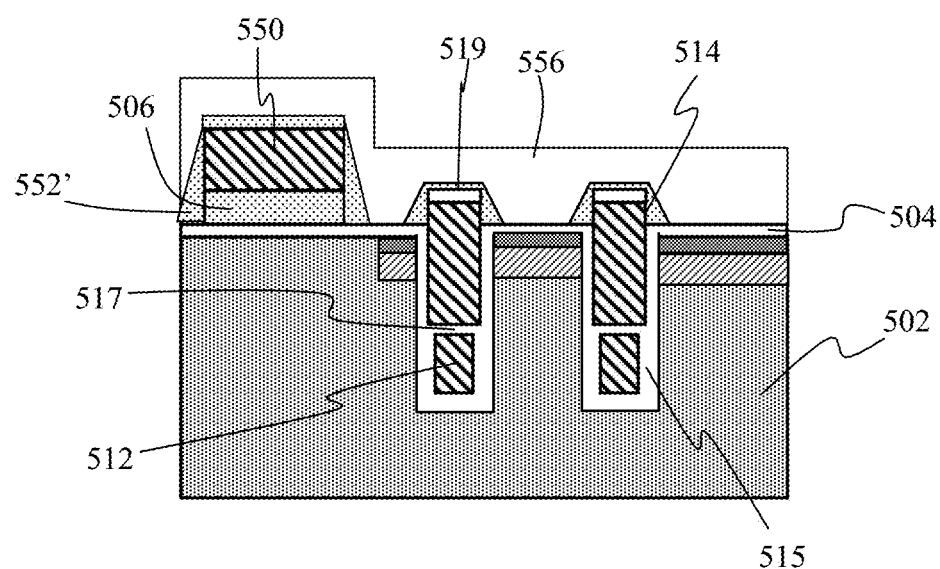

Next, a low temperature oxide (LTO) layer and a borophosphosilicate glass (BPSG) layer 556 are deposited as shown in FIG. 5N. In one example, the LTO layer is in a thickness about 3000 Å and the BPSG layer is about 10000 Å. Then a BPSG flow process and etchback process are performed.

Figure 5O:
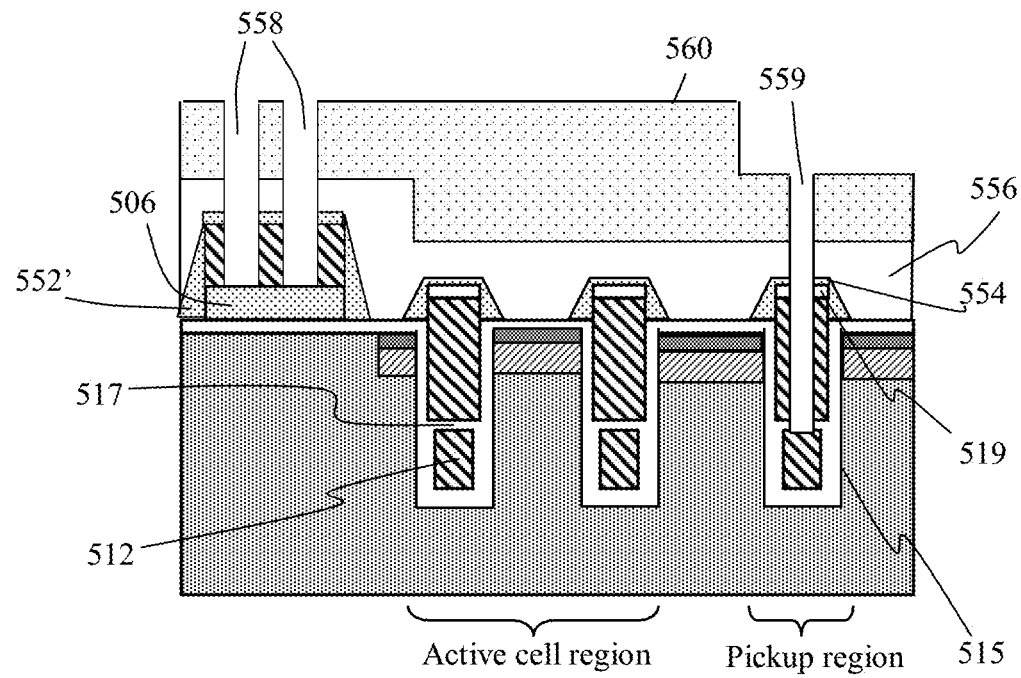

A first contact mask 560 is applied and an etch process is performed to form ESD contact openings 558 through the BPSG layer and the LTO layer as shown in FIG. 5O. In the pickup regions, an etch step is performed to etch ONO stack (556, 554 and 519), and etch through the top conductive layer 514 to reach the bottom conductive layer 512 to form a contact structure opening 559 for contact structures that connect the top and bottom conductive layers 514 and 512 together.

Figure 5P:
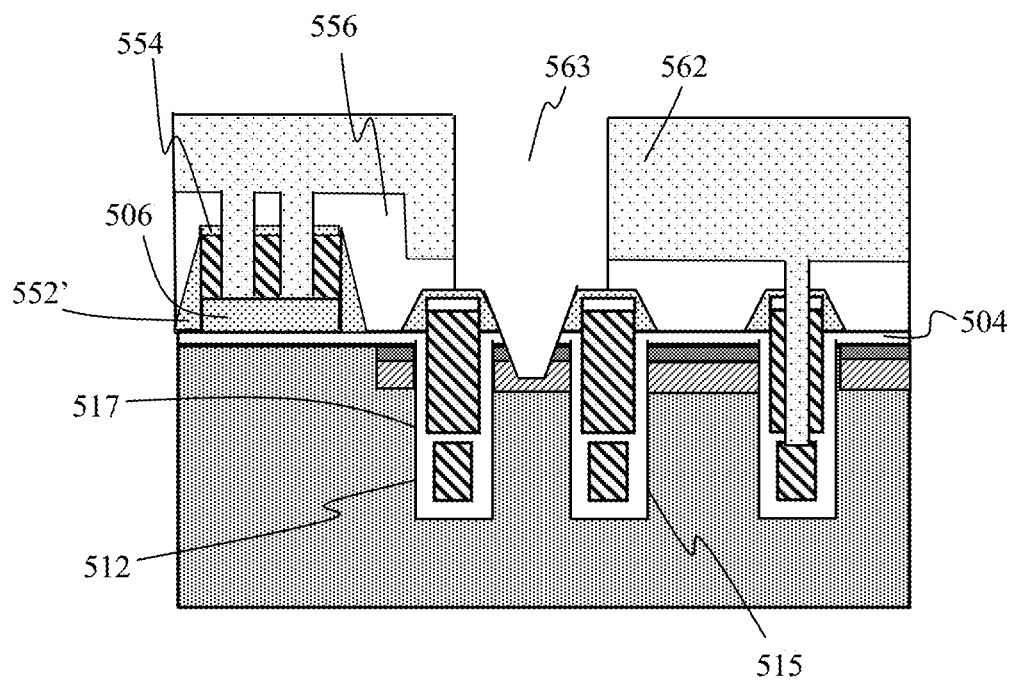
Figure 5Q:
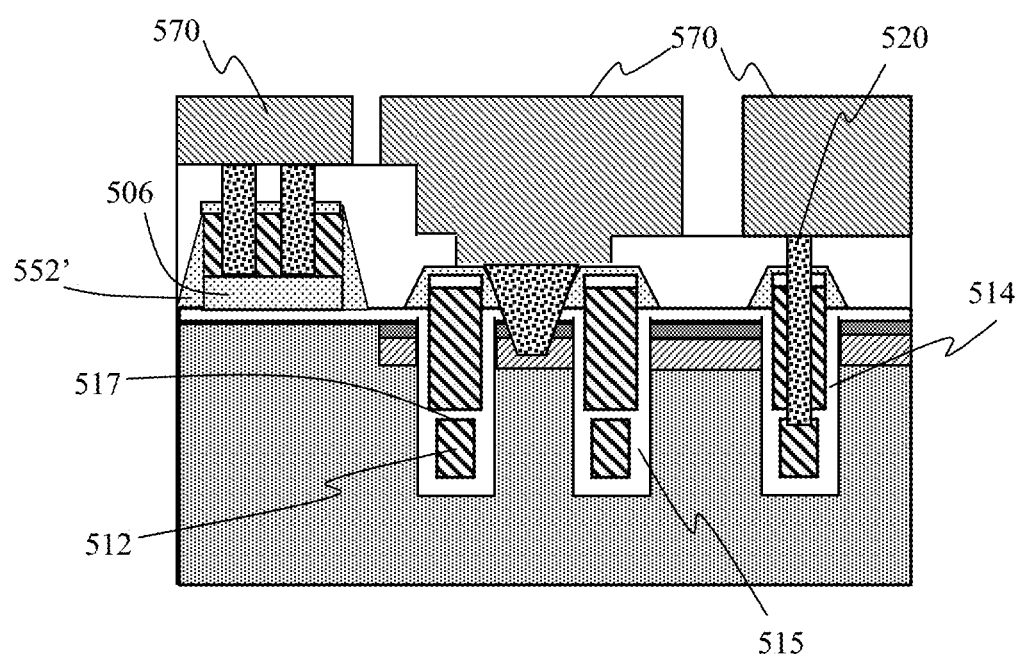

Another contact mask 562 is applied and another etch process is performed to open the arrays of source and body contact openings 563 between the trenches in the active cell region as shown in FIG. 5P. In the illustrated example, the ONO stack (556, 552' and 504) is etched below the surface of the substrate, for example, for about 0.27 μm. Then a barrier metal layer (not shown) is lined on the sidewalls and bottom of the contact openings followed by the deposition of a conductive material, e.g., Tungsten, in the contact openings forming the conductive plugs. As shown in FIG. 5Q, conductive plugs 520 are formed to connect the top conductive layer 514 and the bottom conductive layer 512 together. Following that, a layer of metal 570 is deposited. A metal mask is used and an etch process is performed. The wafer is then followed the rest of standard trench MOSFET steps to complete the processing.

In the embodiments where the connection between the top electrode and bottom electrode is not desired, one additional mask is required after formation of the top electrode to etch the top conductive layer 514 and fill oxides to form an insulating structure near the contact structure 520 thereby removing connection between the top and bottom electrodes.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶ 6.

What is claimed is:

1. A method for fabricating a transistor device, the method comprising:
   a) forming a plurality of trenches in a semiconductor substrate, each trench in the plurality being lined with an insulating material along sidewalls inside each trench in the plurality;
   b) forming a bottom electrode in lower portions of each trench in the plurality;

c) forming a top electrode in upper portions of each trench in the plurality, wherein the top electrode is separated from the bottom electrode by an inter-electrode insulating layer; and d) forming a plurality of contact structures, each contact structure in the plurality of contact structures being formed in a corresponding trench in the plurality of trenches in an area outside of an active region of the device, wherein each contact structure in the plurality of contact structures penetrates through an opening in a portion of the top electrode in the corresponding trench of the plurality of trenches and through an opening in a corresponding portion of the inter-electrode insulating layer beneath the top electrode in the corresponding trench of the plurality of trenches to reach the bottom electrode in the corresponding trench of the plurality of trenches, and wherein each contact structure in the plurality of contact structures is filled with a conductive material and provides electrical connection between the bottom electrode formed in the corresponding trench in the plurality of trenches and the top electrode formed in the corresponding trench in the plurality of trenches.

2. The method of claim 1, further comprising forming one or more insulating structures, each of the one or more insulating being configured to electrically isolate a portion of the top electrode formed in an upper portion of a corresponding trench in the plurality of trenches from electrical contact with the bottom electrode formed in a lower portion of the corresponding trench in the plurality of trenches.

3. The method of claim 2, wherein each of the one or more insulating structures is formed near a corresponding contact structure the plurality of contact structures and wherein each of the one or more insulating structures is filled with an insulating material.

4. The method of claim 1, further comprising forming an electrostatic discharge (ESD) protection structure configured to provide electrostatic discharge protection to the device.

5. The method of claim 1, wherein the insulating material lined along sidewalls in upper portions of each trench in the plurality of trenches has a thickness less than that of the insulating material lined along sidewalls in lower portions of each trench in the plurality.

6. The method of claim 1, wherein forming the plurality of contact structures includes etching through the top electrode in the corresponding trench of the plurality of trenches and the inter-electrode insulating layer in the corresponding trench of the plurality of trenches beneath the top electrode to reach the bottom electrode in the corresponding trench of the plurality of trenches.

7. The method of claim 1, wherein the top electrode formed in the upper portions of each trench in the plurality and bottom electrode formed in the lower portions of each trench in the plurality are made of doped polysilicon and the plurality of contact structures are made of a metal.

* * * * *